United States Patent
Ryu

(10) Patent No.: US 9,118,292 B2
(45) Date of Patent: Aug. 25, 2015

(54) BELL SOUND OUTPUTTING APPARATUS AND METHOD THEREOF

(75) Inventor: Jong-youb Ryu, Daegu (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 848 days.

(21) Appl. No.: 13/194,209

(22) Filed: Jul. 29, 2011

(65) Prior Publication Data

US 2012/0027225 A1  Feb. 2, 2012

(30) Foreign Application Priority Data

Jul. 30, 2010  (KR) .................. 10-2010-0073775

(51) Int. Cl.
*H03G 3/20* (2006.01)
*H03G 3/24* (2006.01)
*H03G 3/32* (2006.01)
*H04M 19/04* (2006.01)

(52) U.S. Cl.
CPC .. *H03G 3/24* (2013.01); *H03G 3/32* (2013.01); *H04M 19/042* (2013.01); *H04M 19/044* (2013.01)

(58) Field of Classification Search
CPC ..... H03G 3/32; H04M 19/044; H04M 19/042

USPC ........................................................... 381/57
See application file for complete search history.

(56) References Cited

U.S. PATENT DOCUMENTS

| 5,844,983 | A  | * | 12/1998 | Lilja ............................. 379/418 |
| 6,363,265 | B1 | * | 3/2002  | Ritter ........................... 455/567 |
| 7,903,825 | B1 | * | 3/2011  | Melanson ....................... 381/57 |

FOREIGN PATENT DOCUMENTS

| KR | 1996-0006532 A | 2/1996 |
| KR | 10-2005-0029314 A | 3/2005 |

* cited by examiner

*Primary Examiner* — Joseph Saunders, Jr.
(74) *Attorney, Agent, or Firm* — Sughrue Mion, PLLC

(57) ABSTRACT

A method and apparatus for outputting a bell sound are disclosed. The method includes receiving an ambient noise; extracting a target frequency band from the ambient noise; changing volume of a pre-stored bell sound by using the target frequency band; and outputting the changed pre-stored bell sound. In the apparatus for outputting a bell sound, when a bell sound outputting apparatus receives an incoming call signal, a user may hear a bell sound including a signal in a frequency band not existing in a peripheral environment, and thus may easily recognize the bell sound.

18 Claims, 6 Drawing Sheets

BELL SOUND OUTPUTTING APPARATUS AND METHOD THEREOF

CROSS-REFERENCE TO RELATED PATENT APPLICATION

This application claims the benefit of Korean Patent Application No. 10-2010-0073775, filed on Jul. 30, 2010, in the Korean Intellectual Property Office, the disclosure of which is incorporated herein in its entirety by reference.

BACKGROUND

1. Field

The exemplary embodiments relate to a bell sound outputting apparatus and method thereof, whereby the volume of a bell sound that is output from the bell sound outputting apparatus is changed by using information related to a frequency extracted from an ambient noise around the vicinity of the bell sound outputting apparatus.

2. Description of the Related Art

In order to output a bell sound, a bell sound outputting apparatus sets a bell sound as an output bell sound, wherein the bell sound is selected by a user, from among several types of bell sounds. Upon receipt of an incoming call signal, the bell sound outputting apparatus outputs the bell sound so as to inform the user of the incoming call signal. However, if the bell sound outputting apparatus is in an environment with heavy ambient noise, the user may have difficulty in recognizing the bell sound.

SUMMARY

According to an aspect of the exemplary embodiments, there is provided a bell sound outputting apparatus including an input unit for receiving an ambient noise; an extracting unit which extracts a target frequency band from the ambient noise; a control unit which changes the volume of a pre-stored bell sound by using the target frequency band; and an output unit which outputs the changed pre-stored bell sound.

The bell sound outputting apparatus may compare a magnitude of the ambient noise with a first reference value and then may extract the target frequency band.

The control unit may change the volume of the pre-stored bell sound in the target frequency band to volume that is equal to or greater than the first reference value.

The control unit may change a magnitude of the ambient noise in the target frequency band, and may change the volume of the pre-stored bell sound by using the changed ambient noise.

The control unit may change the volume of the pre-stored bell sound by adding the changed ambient noise to the pre-stored bell sound at regular intervals.

The extracting unit may extract one or more frequency bands as the target frequency band, wherein the magnitude of the ambient noise sequentially decreases in the one or more frequency bands.

The bell sound outputting apparatus may further include a determining unit which determines whether the bell sound outputting apparatus outputs a bell sound or a vibration signal, by using the magnitude of the ambient noise.

The determining unit may compare the magnitude of the ambient noise with a second reference value and then may determine whether the bell sound outputting apparatus outputs a bell sound or a vibration signal.

The input unit may receive the ambient noise when an incoming call signal is received.

According to another aspect of the exemplary embodiments, there is provided a bell sound outputting apparatus including an input unit which receives an ambient noise; an extracting unit which extracts a target frequency band from the ambient noise; a control unit which generates a new bell sound in the target frequency band; and an output unit which outputs the new bell sound.

According to another aspect of the exemplary embodiments, there is provided a method of outputting a bell sound, the method including the operations of receiving an ambient noise; extracting a target frequency band from the ambient noise; changing the volume of a pre-stored bell sound by using the target frequency band; and outputting the changed pre-stored bell sound.

The operation of extracting the target frequency band may include the operation of comparing a magnitude of the ambient noise with a first reference value and then extracting the target frequency band.

The operation of changing the volume may include the operation of changing the volume of the pre-stored bell sound in the target frequency band to a volume that is equal to or greater than the first reference value.

The operation of changing the volume may include the operations of changing a magnitude of the ambient noise in the target frequency band, and changing the volume of the pre-stored bell sound by using the changed ambient noise.

The operation of changing the volume may include the operation of changing the volume of the pre-stored bell sound by adding the changed ambient noise to the pre-stored bell sound at regular intervals.

The operation of extracting the target frequency band may include the operation of extracting one or more frequency bands as the target frequency band, wherein the magnitude of the ambient noise sequentially decreases in the one or more frequency bands.

The method may further include the operation of determining whether to output a bell sound or a vibration signal by using the magnitude of the ambient noise.

The operation of determining may include the operation of comparing the magnitude of the ambient noise with a second reference value and then determining whether to output the bell sound or the vibration signal.

The receiving of the ambient noise may include the operation of receiving the ambient noise when an incoming call signal is received.

According to another aspect of the exemplary embodiments, there is provided a method of outputting a bell sound, the method including the operations of receiving an ambient noise; extracting a target frequency band from the ambient noise; generating a new bell sound in the target frequency band; and outputting the new bell sound.

BRIEF DESCRIPTION OF THE DRAWINGS

The above and other features and advantages of the exemplary embodiments will become more apparent by describing in detail the exemplary embodiments thereof with reference to the attached drawings in which.

DETAILED DESCRIPTION

Figure 1:
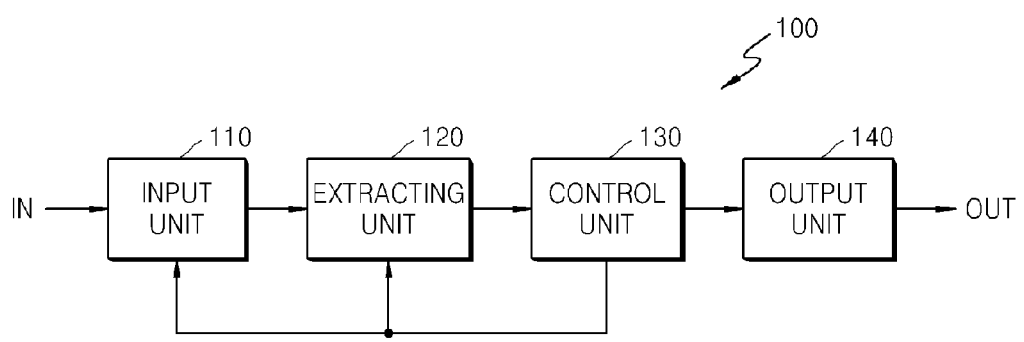
FIG. 1 is a block diagram of a bell sound outputting apparatus according to an exemplary embodiment.

Hereinafter, the exemplary embodiments will be described in detail by explaining the exemplary embodiments with reference to the attached drawings. The exemplary embodiments may, however, be embodied in many different forms and should not be construed as being limited to the embodiments set forth herein. Like reference numerals in the drawings denote like elements.

A bell sound outputting apparatus according to one or more exemplary embodiments receives an ambient noise, that is, a signal occurring in an environment in the vicinity of the bell sound outputting apparatus. The bell sound outputting apparatus analyzes a frequency of the ambient noise, and extracts a frequency band in which a magnitude of the signal is small or slight.

The bell sound outputting apparatus may change volume of a bell sound stored in the bell sound outputting apparatus by using the extracted frequency band. For example, the bell sound outputting apparatus may increase a magnitude of a signal of the bell sound in a frequency band corresponding to the extracted frequency band. Afterward, the bell sound outputting apparatus may output the bell sound whose signal magnitude is changed.

FIG. 1 is a block diagram of a bell sound outputting apparatus 100 according to an exemplary embodiment.

Referring to FIG. 1, bell sound outputting apparatus 100 includes an input unit 110, an extracting unit 120, a control unit 130, and an output unit 140.

Bell sound outputting apparatus 100 is an apparatus for outputting a bell sound. For example, the bell sound outputting apparatus may be a phone, a mobile phone, a smart phone, a portable multimedia player (PMP), a MPEG Audio Layer-3 (MP3) player, a personal computer (PC)/a navigation equipment/a headset/portable devices having a phone function, etc.

Input unit 110 receives an ambient noise. For example, input unit 110 may include a microphone, a sound sensor, etc. Input unit 110 may receive the ambient noise during a predetermined time period, wherein the ambient noise is a signal occurring in an environment in the vicinity of bell sound outputting apparatus 100. The predetermined time period may be about 0.5 second, in which a user may not recognize a delay in outputting the bell sound and in which a characteristic of a frequency of the ambient noise may be analyzed, but the exemplary embodiments are not limited thereto.

When bell sound outputting apparatus 100 receives an incoming call signal, input unit 110 may receive the ambient noise. For example, input unit 110 may receive the ambient noise for about 0.5 second from when the incoming call signal is received. Also, when bell sound outputting apparatus 100 is in a standby mode, input unit 110 may receive the ambient noise at regular or random intervals. Input unit 110 transfers the received ambient noise to extracting unit 120.

Extracting unit 120 extracts a target frequency band from the ambient noise.

Extracting unit 120 may compare a magnitude of the ambient noise with a first reference value and then may extract the target frequency band. For example, extracting unit 120 may analyze the frequency of the ambient noise and may then determine which frequency band is to be the target frequency band; wherein a frequency band is determined to be the target frequency band according to whether the magnitude of the ambient noise is equal to or less than the first reference value. The first reference value may be determined according to the ambient noise received by input unit 110 during the predetermined time period. For example, the ambient noise is obtained by input unit 110 during the predetermined time period, and then an average value, a median value, or an absolute value of the magnitude of the obtained signal may be the first reference value. Also, a pre-set value may be used as the first reference value. The pre-set value may be a value of about 65 dB, that is, a level suitable for a user to distinguish between the ambient noise and the bell sound. Also, the first reference value may vary across frequency bands. Considering that the sensitivity of a human acoustic sense with respect to frequency bands varies, the first reference value may be a relatively small value in a frequency band in which the sensitivity of the human acoustic sense is relatively high, and may be a greater value in a frequency band in which the sensitivity of the human acoustic sense is relatively low.

Extracting unit 120 may extract the target frequency band according to a predetermined unit. For example, extracting unit 120 may determine the predetermined unit according to a characteristic of human acoustic sense. In particular, in a frequency band between 100 Hz-1000 Hz, in which the sensitivity of the human acoustic sense is relatively high, extracting unit 120 may extract a frequency band in which the magnitude of the ambient noise is equal to or less than the first reference value, according to units of 100 Hz. Also, in a frequency band between 1000 Hz-8000 Hz, in which the sensitivity of human acoustic sense is relatively low, extracting unit 120 may extract a frequency band in which the magnitude of the ambient noise is equal to or less than the first reference value, according to units of 1000 Hz. In order to discriminate between the frequency bands in consideration of the characteristic of human acoustic sense, an equal-loudness contours graph in which the characteristic of human acoustic sense is shown, may be used.

In a situation where there are a plurality of frequency bands in which the magnitude of the ambient noise is less than the first reference value, extracting unit 120 may extract the plurality of frequency bands as the target frequency band. As described above, extracting unit 120 may extract the plurality of frequency bands according to units of 100 Hz or 1000 Hz as the target frequency band. Meanwhile, if a range of an extracted frequency band is less than the units of 100 Hz or 1000 Hz, extracting unit 120 may exclude the extracted frequency band from the target frequency band.

For example, extracting unit 120 may extract a plurality of frequency bands in a predetermined frequency band as the target frequency band, wherein the magnitude of the ambient noise in the plurality of frequency bands sequentially decreases across the plurality of frequency bands.

In another example, extracting unit 120 may extract some of a plurality of frequency bands in a predetermined frequency band as the target frequency band, wherein the magnitude of the ambient noise in the plurality of frequency bands is equal to or less than the first reference value in each of the frequency bands. For example, from among a plurality of frequency bands in which the magnitude of the ambient noise is equal to or less than the first reference value in a frequency band between 1000 Hz-8000 Hz in which a human auditory sense is not highly effected, extracting unit 120 may extract a predetermined number of the frequency bands as the target frequency band according to an order in which the magnitude of the ambient noise in the frequency bands sequentially decreases. Extracting unit 120 transfers information to control unit 130, wherein the information is about the target frequency band obtained from the ambient noise.

Control unit 130 changes volume of a pre-stored bell sound in the target frequency band extracted from extracting unit 120. For example, control unit 130 may search for a signal of the pre-stored bell sound in the target frequency band, and may change a magnitude of the signal in the target frequency band to a random value equal to or greater than the first reference value. The random value equal to or greater than the first reference value may be a value corresponding to a magnitude of a signal that allows a user to recognize the incoming call signal, despite the ambient noise. For this situation, control unit 130 may set a value obtained by multiplying the first reference value by an amplifying coefficient for increasing the volume of the pre-stored bell sound, as the volume of the pre-stored bell sound in the target frequency band.

Also, control unit 130 may change a magnitude of a signal in the target frequency band by using a magnitude of a signal in a neighboring frequency band. For example, control unit 130 may obtain a target frequency band in units of 100 Hz, and may calculate an average value of a magnitude of a signal in the obtained target frequency band. Afterward, control unit 130 may select a frequency band ranging from 100 Hz of the obtained target frequency band, that is, a neighboring frequency band, and may calculate an average value of a magnitude of a signal in the selected frequency band. Afterward, control unit 130 may calculate a ratio between the magnitudes of the signals of the obtained target frequency band and the neighboring frequency band by using the average value of the magnitude of the signal in the obtained target frequency band and the average value of the magnitude of the signal in the neighboring frequency band.

When control unit 130 changes the magnitude of the signal in the target frequency band to the random value equal to or greater than the first reference value, control unit 130 may increase the magnitude of the signal in the neighboring frequency band until a ratio between the changed magnitude of the signal in the target frequency band and the magnitude of the signal in the neighboring frequency band is equivalent to or approximately the ratio that is calculated before the change. In order to allow the ratio before the change to be equivalent or approximate to the ratio after the change, e.g., in order to allow a difference between the ratio before the change and the ratio after the change to be equal to or less than 50%, the magnitude of the signal in the neighboring frequency band may be increased.

For example, when control unit 130 extracts a target frequency band in a specific frequency band, e.g., a frequency band between 1000 Hz-8000 Hz, control unit 130 may obtain the target frequency band according to a predetermined unit, e.g., in units of 1000 Hz. Afterwards, control unit 130 may increase both a magnitude of a signal in the target frequency band and a magnitude of a signal in a neighboring frequency band by using a ratio between an average value of the magnitude of the signal in the target frequency band and an average value of the magnitude of the signal in the neighboring frequency band in units of 1000 Hz.

In this situation, although the magnitude of the signal in the target frequency band is changed by control unit 130, an envelope of a changed bell sound becomes similar to an envelope of the pre-stored bell sound, so that a user may easily recognize his or her own bell sound in a noisy environment.

In a situation where the volume of the pre-stored bell sound in the target frequency band is already equal to or greater than the first reference value, control unit 130 may not change the magnitude of the signal, and may use the pre-stored bell sound as the changed bell sound. Also, in a situation where the target frequency band includes a plurality of frequency bands, control unit 130 may change the volume of the pre-stored bell sound in each of the plurality of frequency bands to a value that is equal to or greater than the first reference value.

In another example, control unit 130 may change the volume of the pre-stored bell sound by using the ambient noise in the target frequency band. For example, control unit 130 may change the magnitude of the ambient noise in the target frequency band to a value that is greater than the first reference value. Afterwards, control unit 130 may change the volume of the pre-stored bell sound by adding the changed ambient noise in the target frequency band to the pre-stored bell sound.

Control unit 130 may generate a new bell sound in the target frequency band. For example, control unit 130 may generate a new signal having a magnitude equal to or greater than the first reference value in the target frequency band, and may generate the new bell sound by using the generated signal without changing the generated signal, by changing the generated signal, or by combining the generated signal with the pre-stored bell sound.

In a situation where the target frequency band includes a plurality of frequency bands, control unit 130 may change the volume of the pre-stored bell sound in each of the plurality of frequency bands. Also, control unit 130 may change the magnitude of the ambient noise in each of the plurality of frequency bands, and may change the volume of the pre-stored bell sound by using the changed ambient noise. In addition, control unit 130 may generate new signals in the plurality of frequency bands, and may generate a new bell sound by using the new signals without changing the new signals, by changing the new signals, or by combining the new signals with the pre-stored bell sound.

Control unit 130 may transfer the bell sound to output unit 140, wherein the bell sound has the signal whose magnitude in the target frequency band has been changed. Also, control unit 130 may transfer a newly generated signal to output unit 140, wherein the newly generated signal has a magnitude that is equal to or greater than the first reference value.

Output unit 140 outputs the changed bell sound that is received from control unit 130. For example, output unit 140 may include a speaker or an output port for storing or transferring the changed bell to an external device. Also, output unit 140 may output the signal generated by control unit 130.

In a situation where bell sound outputting apparatus 100 outputs a changed or newly generated bell sound, upon receipt of the incoming call signal, a user may hear the bell sound including a signal in a predetermined frequency band that does not exist in an ambient environment or which has a small magnitude. That is, the user may easily recognize his or her own bell sound in a noisy environment, so that the user may recognize the receipt of the incoming call signal.

Figure 2:
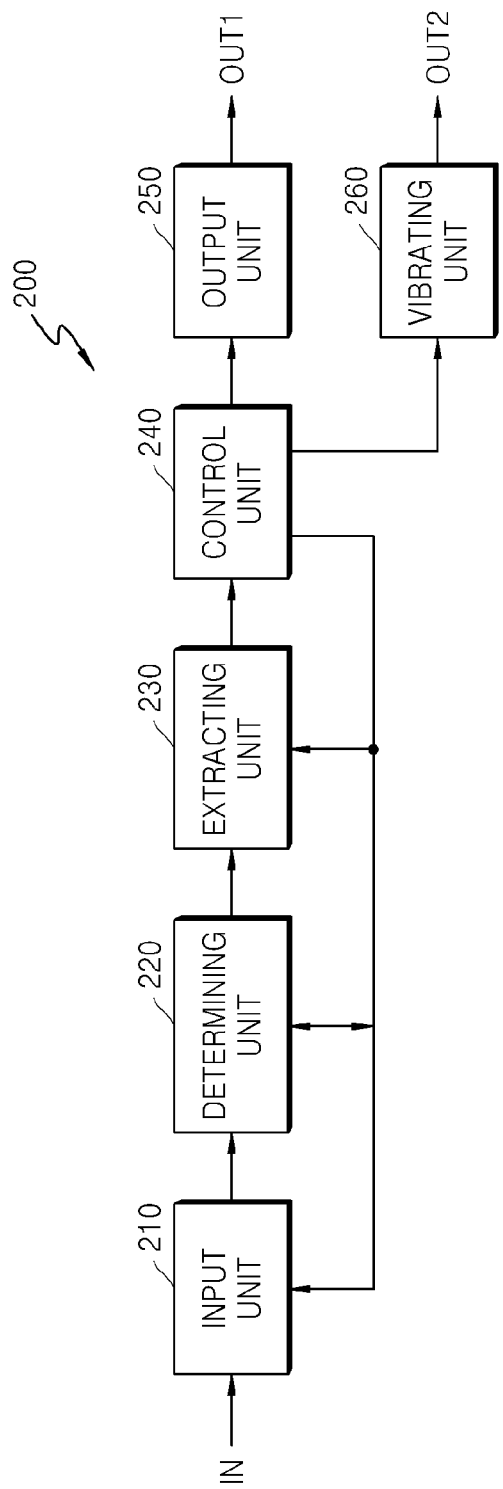
FIG. 2 is a block diagram of a bell sound outputting apparatus according to another exemplary embodiment.

FIG. 2 is a block diagram of a bell sound outputting apparatus 200 according to another exemplary embodiment.

Referring to FIG. 2, bell sound outputting apparatus 200 may include an input unit 210, a determining unit 220, an extracting unit 230, a control unit 240, an output unit 250 and a vibrating unit 260.

Input unit 210, extracting unit 230, control unit 240, and output unit 250 included in the bell sound outputting apparatus 200 of FIG. 2 perform the same functions as those of input unit 110, extracting unit 120, control unit 130, and output unit 140 included in the bell sound outputting apparatus 100 of FIG. 1, respectively, and thus the descriptions thereof are omitted here.

Determining unit 220 compares a magnitude of an ambient noise with a second reference value, and then determines whether the bell sound outputting apparatus 200 is to output a bell sound or a vibration signal. The second reference value may be a reference value which is used by the determining unit 220 may recognize whether the bell sound outputting apparatus 200 is in a quiet environment or in a noisy environment. The second reference value may be the same value as a first reference value used by the extracting unit 230, but is not limited thereto, and thus, one of various values may be used as the second reference value according to a peripheral environment or a user characteristic.

In a situation where the magnitude of the ambient noise received from the input unit 210 is equal to or greater than the second reference value, the determining unit 220 may determine to change and output the bell sound, and may inform the control unit 240 about the determination. In this situation, control unit 240 may control extracting unit 230 in order to extract a target frequency band from the ambient noise. Afterwards, control unit 240 may change the volume of a pre-stored bell sound in the target frequency band, and may transfer a changed bell sound to output unit 250.

In a situation where the magnitude of the ambient noise received from input unit 210 is equal to or less than the second reference value, determining unit 220 may make a determination not to change the bell sound, and may inform control unit 240 about the determination. In this situation, control unit 240 may control extracting unit 230 so as not to extract a target frequency band, and may transfer a pre-stored bell sound to output unit 250. Instead of outputting the bell sound, control unit 240 may control vibrating unit 260 in order to vibrate bell sound outputting apparatus 200.

Figure 3:
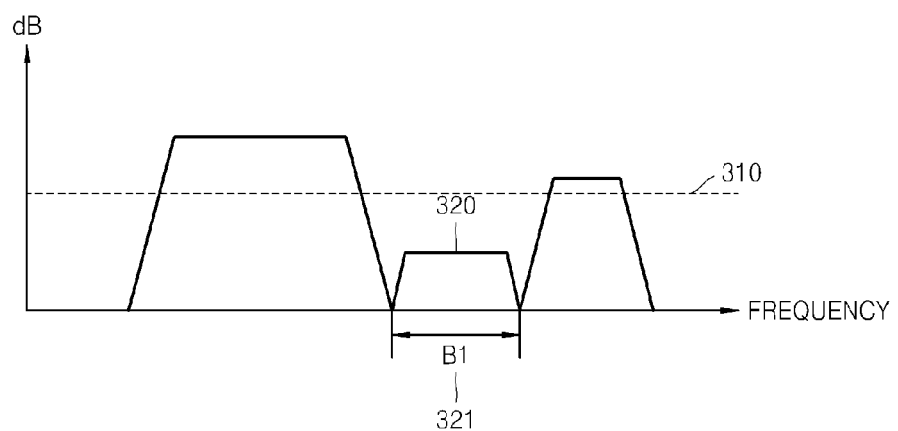
FIG. 3 is a graph for illustrating a procedure for extracting a target frequency band, according to an exemplary embodiment.

FIG. 3 is a graph for illustrating a procedure for extracting a target frequency band, according to an exemplary embodiment.

The graph of FIG. 3 indicates an ambient noise, and a Y-axis of the graph indicates magnitude and an X-axis of the graph indicates frequency. The dotted line in FIG. 3 indicates a first reference value 310. Extracting units 120 and 230 may compare a magnitude of the ambient noise with the first reference value 310, and then may select a frequency band including a signal 320 having a magnitude that is less than the first reference value 310. In FIG. 3, signal 320 having a magnitude less than the first reference value 310 is in a frequency band B1(321).

Extracting units 120 and 230 may determine the frequency band B1 (321) as a target frequency band, and may transfer information about the target frequency band to control units 130 and 240.

Figure 4:
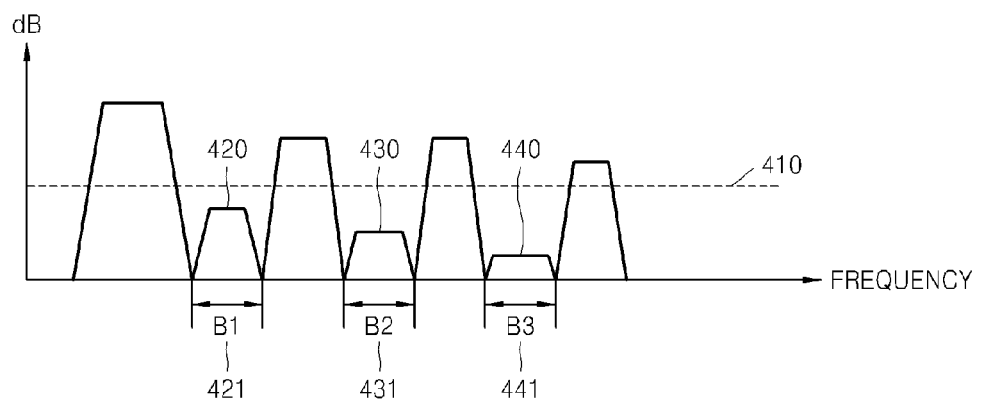
FIG. 4 is a graph for illustrating a procedure for extracting a target frequency band, according to another exemplary embodiment.

FIG. 4 is a graph for illustrating a procedure for extracting a target frequency band, according to another exemplary embodiment.

The graph of FIG. 4 indicates an ambient noise. A Y-axis of the graph indicates magnitude, and an X-axis of the graph indicates frequency. The dotted line in FIG. 4 indicates a first reference value 410. Extracting units 120 and 230 may compare a magnitude of the ambient noise with the first reference value 410, and then may select a plurality of signals 420, 430, and 440 having magnitudes that are less than first reference value 410. In FIG. 4 the plurality of signals 420, 430, and 440 having magnitudes less than first reference value 410 are respectively in frequency bands B1(421), B2(431), and B3(441).

Extracting units 120 and 230 may determine frequency bands B1(421), B2(431), and B3(441) as a target frequency band, and may transfer information about the target frequency band to control units 130 and 240.

Figure 5:
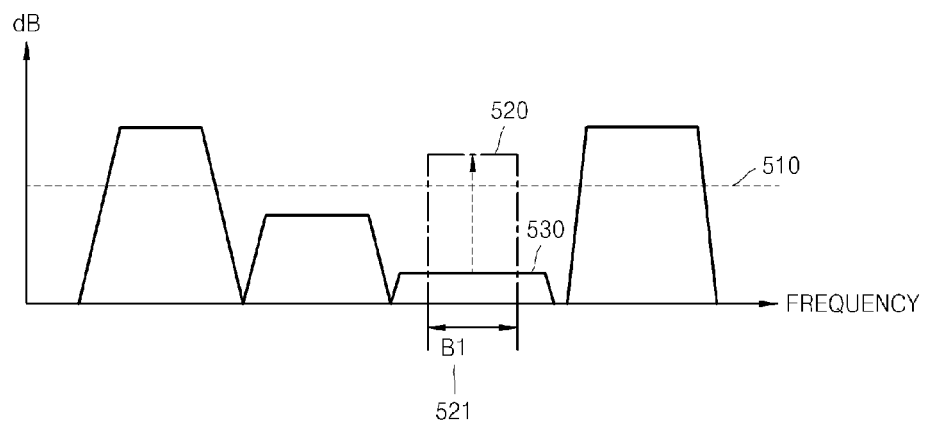
FIG. 5 is a graph for illustrating a procedure for changing a bell sound in a target frequency band according to an exemplary embodiment.

FIG. 5 is a graph for illustrating a procedure for changing a bell sound in a target frequency band according to an exemplary embodiment of the present invention.

The graph of FIG. 5 indicates a pre-stored bell sound in bell sound outputting apparatuses 100 and 200. A Y-axis of the graph in FIG. 5 indicates magnitude, and an X-axis of the graph in FIG. 5 indicates frequency. The dotted line in FIG. 5 indicates a first reference value 510. Control units 130 and 240 may receive information about a target frequency band from extracting units 120 and 230, and may change the volume of the pre-stored bell sound in the target frequency band. For example, when the target frequency band is a frequency band B1(521), control units 130 and 240 may change a magnitude of a signal 530 of the pre-stored bell sound in frequency band B1(521) to a signal 520 having a random magnitude equal to or greater than first reference value 510. Afterwards, control units 130 and 240 may transfer a bell sound having a signal whose magnitude is changed to the output units 140 and 250.

Figure 6:
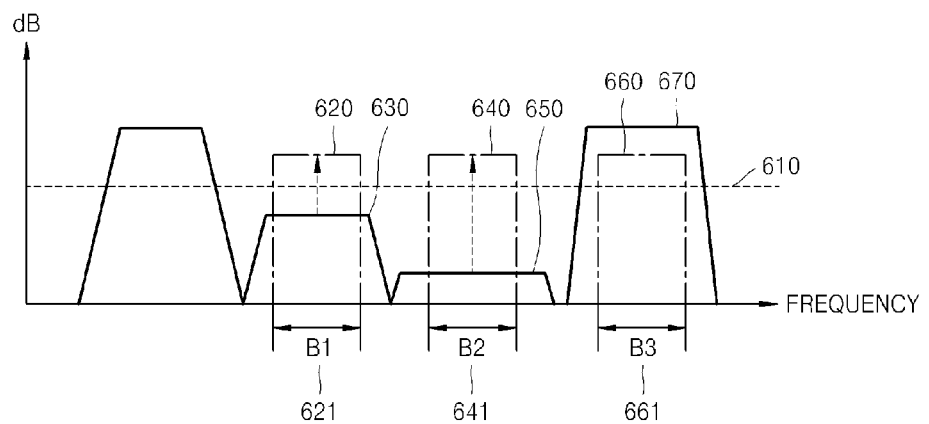
FIG. 6 is a graph for illustrating a procedure for changing a bell sound in a target frequency band according to another exemplary embodiment.

FIG. 6 is a graph for illustrating a procedure for changing a bell sound in a target frequency band according to another exemplary embodiment.

The graph of FIG. 6 indicates a pre-stored bell sound in the bell sound outputting apparatuses 100 and 200. A Y-axis of the graph in FIG. 6 indicates magnitude, and an X-axis of the graph in FIG. 6 indicates frequency. The dotted line in FIG. 6 indicates a first reference value 610. Control units 130 and 240 may receive information about a target frequency band from extracting units 120 and 230, and may change the volume of the pre-stored bell sound in the target frequency band. For example, when the target frequency band includes a plurality of frequency bands, control units 130 and 240 may change a magnitude of a signal of the pre-stored bell sound in one of the plurality of frequency bands to a signal having a random magnitude that is equal to or less than first reference value 610.

FIG. 6 corresponds to a situation in which the target frequency band includes a plurality of frequency bands B1(621), B2(641), and B3(661). In this situation, control units 130 and 240 may change a magnitude of a signal 630 of the pre-stored bell sound in the frequency band B1(621) from among the plurality of frequency bands, to a signal 620 having a magnitude that is equal to or less than first reference value 610. Also, control units 130 and 240 may change a magnitude of a signal 650 of the pre-stored bell sound in the frequency band B2(641) to a signal 640 having a magnitude that is equal to or less than first reference value 610. Meanwhile, control units 130 and 240 may change a magnitude of a signal 670 of the pre-stored bell sound in the frequency band B3(661) to a signal 660 having a magnitude that is equal to or less than the first reference value 610. However, since the magnitude of signal 670 of the pre-stored bell sound is already greater than first reference value 610, it is optional as to whether to change the magnitude of signal 670. Afterwards, control units 130 and 240 may transfer a bell sound having a changed signal magnitude to output units 140 and 250.

Figure 7:
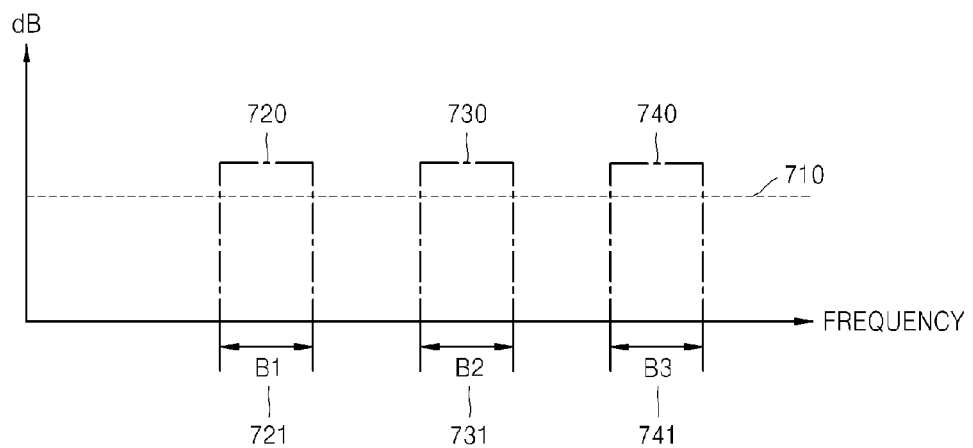
FIG. 7 is a graph for illustrating a procedure for generating a bell sound in a target frequency band according to another exemplary embodiment.

FIG. 7 is a graph for illustrating a procedure for generating a bell sound in a target frequency band according to another exemplary embodiment.

Referring to FIG. 7, a Y-axis of the graph of FIG. 7 indicates magnitude, and an X-axis of the graph of FIG. 7 indicates frequency. The dotted line in FIG. 7 indicates a first reference value 710. Control units 130 and 240 may receive information about the target frequency band from extracting units 120 and 230 and may generate a signal having a random magnitude that is equal to or greater than the first reference value 710 in the target frequency band. In a situation where the target frequency band includes a plurality of frequency bands, control units 130 and 240 may newly generate signals having random magnitudes in the plurality of frequency bands, may combine the generated signals, and then may generate a new bell sound. For example, in a situation where the target frequency band includes a plurality of frequency bands B1(721), B2(731), and B3(741), control units 130 and 240 may generate signals 720, 730, and 740 having magnitudes equal to or greater than a first reference value and correspond to the frequency bands B1(721), B2(731), and B3(741), respectively. Afterwards, control units 130 and 240 may generate a new bell sound by combining or changing signals 720, 730, and 740, and then may transfer the new bell sound to output units 140 and 250.

Figure 8:
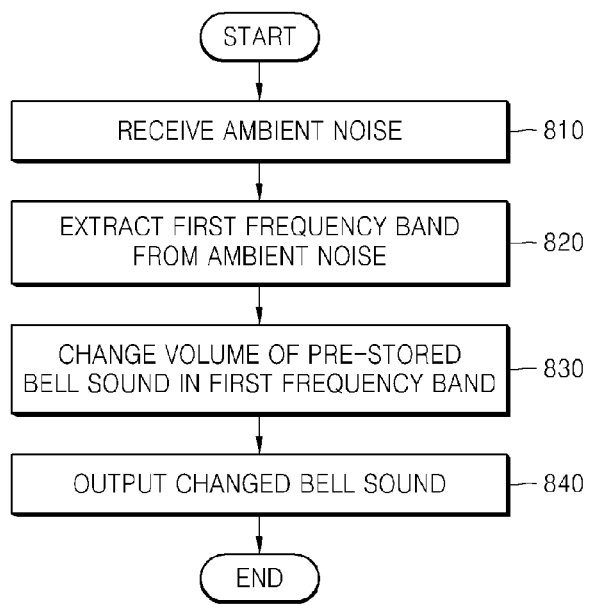
FIG. 8 is a flowchart of a method of outputting a bell sound, according to an exemplary embodiment.

FIG. 8 is a flowchart of a method of outputting a bell sound, according to an exemplary embodiment.

Bell sound outputting apparatus 100 receives an ambient noise (operation 810). Bell sound outputting apparatus 100 may receive the ambient noise during a predetermined time period, wherein the ambient noise is a signal occurring in an environment in the vicinity of bell sound outputting apparatus 100. For example, bell sound outputting apparatus 100 may receive the ambient noise during the predetermined time period from when bell sound outputting apparatus 100 receives an incoming call signal.

Bell sound outputting apparatus 100 extracts a target frequency band from the ambient noise (operation 820). Bell sound outputting apparatus 100 may compare a magnitude of the ambient noise with a first reference value and then may extract the target frequency band. For example, bell sound outputting apparatus 100 may analyze a frequency of the ambient noise and may then select a frequency band as the target frequency band, wherein, in the frequency band selected, the magnitude of the ambient noise is equal to or less than the first reference value.

Bell sound outputting apparatus 100 may extract a plurality of frequency bands as the target frequency band. For example, bell sound outputting apparatus 100 may select the plurality of frequency bands in a frequency band in which the magnitude of the ambient noise is less than the first reference value, and may include the plurality of frequency bands in the target frequency band, wherein, in the plurality of frequency bands, the magnitude of the ambient noise sequentially decreases. Also, bell sound outputting apparatus 100 may select a plurality of frequency bands in a predetermined frequency band, regardless of the first reference value, and may then include the plurality of frequency bands in the target frequency band, wherein, in the plurality of frequency bands, the magnitude of the ambient noise sequentially decreases.

Bell sound outputting apparatus 100 may change the volume of a pre-stored bell sound in the target frequency band (operation 830). For example, bell sound outputting apparatus 100 may change a magnitude of a signal in the pre-stored bell sound to a magnitude that is equal to or greater then the first reference value, wherein the signal corresponds to the target frequency band. Meanwhile, bell sound outputting apparatus 100 may change the volume of the pre-stored bell sound by using a value obtained by multiplying the first reference value by an amplifying coefficient.

Bell sound outputting apparatus 100 may change the magnitude of the ambient noise in the target frequency band, and may change the volume of the pre-stored bell sound by using the changed ambient noise. For example, bell sound outputting apparatus 100 may change the magnitude of the ambient noise in the target frequency band to a magnitude that is equal to or greater than the first reference value. Afterwards, bell sound outputting apparatus 100 may change the volume of the pre-stored bell sound by adding the changed ambient noise in the target frequency band to the pre-stored bell sound at regular or random intervals. Meanwhile, in a situation where the target frequency band includes a plurality of frequency bands, bell sound outputting apparatus 100 may change the magnitude of the ambient noise corresponding to each of the plurality of frequency bands.

Bell sound outputting apparatus 100 may output the changed bell sound (operation 840).

Figure 9:
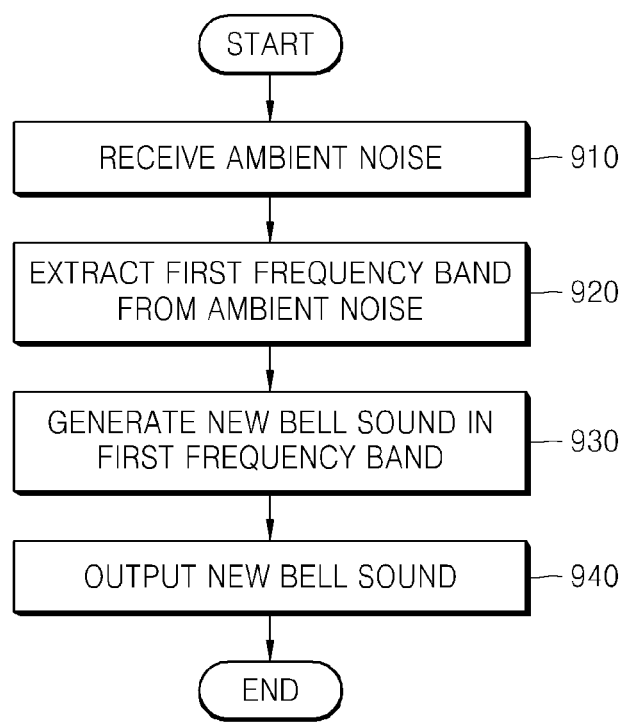
FIG. 9 is a flowchart of a method of outputting a bell sound, according to another exemplary embodiment.

FIG. 9 is a flowchart of a method of outputting a bell sound, according to another exemplary embodiment.

Bell sound outputting apparatus 100 receives an ambient noise (operation 910). Bell sound outputting apparatus 100 may receive the ambient noise during a predetermined time period, wherein the ambient noise is a signal occurring in an environment in the vicinity of bell sound outputting apparatus 100.

Bell sound outputting apparatus 100 extracts a target frequency band from the ambient noise (operation 920). Bell sound outputting apparatus 100 may compare a magnitude of the ambient noise with a first reference value and may then extract the target frequency band. For example, the bell sound outputting apparatus 100 may analyze a frequency of the ambient noise and may then select a frequency band as the target frequency band, wherein, in the selected frequency band, the magnitude of the ambient noise is equal to or less than the first reference value.

Bell sound outputting apparatus 100 may generate a new bell sound by using the extracted target frequency band (operation 930). For example, bell sound outputting apparatus 100 may generate a new signal whose magnitude in the target frequency band is equal to or greater than the first reference value. In a situation where the target frequency band includes a plurality of frequency bands, bell sound outputting apparatus 100 may generate a new bell sound corresponding to each of the plurality of frequency bands.

Bell sound outputting apparatus 100 may change the new bell sound or may add the new bell sound to a pre-stored bell sound.

Bell sound outputting apparatus 100 may output a bell sound (operation 940).

The invention can also be embodied as programmed commands to be executed by various computers, and then can be recorded on a computer readable recording medium including, a non-transitory computer readable storage medium. The computer readable recording medium may include one or more of the programmed commands, data files, data structures, etc. The programmed commands recorded to the computer readable recording medium may be particularly designed or configured for the invention or may be well known to one of ordinary skill in the art. Examples of the computer readable recording medium include magnetic media including hard disks, magnetic tapes, and floppy disks, optical media including CD-ROMs, and DVDs, magneto-optical media including floptical disks, and a hardware apparatus designed to store and execute the programmed commands in read-only memory (ROM), random-access memory (RAM), flash memories, etc. Examples of the programmed commands include not only machine codes generated by a compiler but also include codes to be executed on a computer by using an interpreter. The hardware apparatus can be configured to function as one or more software modules so as to perform operations for the invention, or vice versa.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A bell sound outputting apparatus comprising:
an input unit which receives an ambient noise;
an extracting unit which extracts a target frequency band from the ambient noise;
a control unit which changes a volume of a pre-stored bell sound by using the target frequency band; and
an output unit which outputs the changed pre-stored bell sound;
wherein the control unit changes a magnitude of a signal of the pre-stored bell sound in a frequency band neighboring the target frequency band until a ratio between a changed magnitude of the signal in the target frequency band and a magnitude of the signal in the neighboring frequency band is equivalent to or approximately a ratio between a magnitude of the signal in the target frequency band and a magnitude of the signal in the neighboring frequency band calculated before the change.

2. The bell sound outputting apparatus of claim 1, wherein the target frequency band indicates a frequency band in which a magnitude of the ambient noise is equal to or less than a first reference value.

3. The bell sound outputting apparatus of claim 2, wherein the first reference value indicates a value obtained by measuring the ambient noise during a predetermined time period or indicates a pre-set value.

4. The bell sound outputting apparatus of claim 2, wherein the control unit changes the volume of the pre-stored bell sound in the target frequency band to volume that is equal to or greater than the first reference value.

5. The bell sound outputting apparatus of claim 1, wherein the control unit changes a magnitude of the ambient noise in the target frequency band, and changes the volume of the pre-stored bell sound by using the changed ambient noise.

6. The bell sound outputting apparatus of claim 1, further comprising a determining unit which determines whether to output a bell sound or a vibration signal by using a magnitude of the ambient noise.

7. The bell sound outputting apparatus of claim 6, wherein the determining unit determines whether to output the bell sound or the vibration signal by comparing the magnitude of the ambient noise with a second reference value.

8. The bell sound outputting apparatus of claim 1, wherein the input unit receives the ambient noise when an incoming call signal is received.

9. A bell sound outputting apparatus comprising:
an input unit which receives an ambient noise;
an extracting unit which extracts a target frequency band from the ambient noise;
a control unit which generates a new bell sound in the target frequency band; and
an output unit which outputs the new bell sound,
wherein the control unit changes a magnitude of a signal of the new bell sound in a frequency band neighboring the target frequency band until a ratio between a changed magnitude of the signal in the target frequency band and a magnitude of the signal in the neighboring frequency band is equivalent to or approximately a ratio between a magnitude of the signal in the target frequency band and a magnitude of the signal in the neighboring frequency band calculated before the change.

10. A method of outputting a bell sound, the method comprising:
receiving an ambient noise;
extracting a target frequency band from the ambient noise;
changing a volume of a pre-stored bell sound by using the target frequency band; and
outputting the changed pre-stored bell sound,
wherein the changing of the volume comprises changing a magnitude of a signal of the pre-stored bell sound in a frequency band neighboring the target frequency band until a ratio between a changed magnitude of the signal in the target frequency band and a magnitude of the signal in the neighboring frequency band is equivalent to or approximately a ratio between a magnitude of the signal in the neighboring frequency band calculated before the change.

11. The method of claim 10, wherein the target frequency band indicates a frequency band in which a magnitude of the ambient noise is equal to or less than a first reference value.

12. The method of claim 11, wherein the first reference value indicates a value obtained by measuring the ambient noise during a predetermined time period or indicates a pre-set value.

13. The method of claim 11, wherein the changing of the volume comprises changing the volume of the pre-stored bell sound in the target frequency band to volume that is equal to or greater than the first reference value.

14. The method of claim 10, wherein the changing of the volume comprises:
changing a magnitude of the ambient noise in the target frequency band, and
changing the volume of the pre-stored bell sound by using the changed ambient noise.

15. The method of claim 10, further comprising:
determining whether to output a bell sound or a vibration signal by using a magnitude of the ambient noise.

16. The method of claim 15, wherein the determining comprises determining whether to output the bell sound or the vibration signal by comparing the magnitude of the ambient noise with a second reference value.

17. The method of claim 10, wherein the receiving of the ambient noise comprises receiving the ambient noise when an incoming call signal is received.

18. A method of outputting a bell sound, the method comprising:
receiving an ambient noise;
extracting a target frequency band from the ambient noise;
generating a new bell sound in the target frequency band; and
outputting the new bell sound,
wherein the generating of the new bell sound comprises changing a magnitude of a signal of the new bell sound in a frequency band neighboring the target frequency band until a ratio between a changed magnitude of the signal in the target frequency band and a magnitude of the signal in the neighboring frequency band is equivalent to or approximately a ratio between a magnitude of the signal in the neighboring frequency band calculated before the change.

* * * * *